(12) United States Patent
Tabatake et al.

(10) Patent No.: US 12,349,548 B2
(45) Date of Patent: Jul. 1, 2025

(54) DISPLAY DEVICE

(71) Applicant: Japan Display Inc., Tokyo (JP)

(72) Inventors: Hiroshi Tabatake, Tokyo (JP); Sho Yanagisawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 574 days.

(21) Appl. No.: 17/656,888

(22) Filed: Mar. 29, 2022

(65) Prior Publication Data

US 2022/0320472 A1 Oct. 6, 2022

(30) Foreign Application Priority Data

Mar. 30, 2021 (JP) .................................. 2021-057694

(51) Int. Cl.
| | | |
|---|---|---|
| *H01L 51/52* | (2006.01) | |
| *H10K 50/824* | (2023.01) | |
| *H10K 50/86* | (2023.01) | |
| *H10K 59/122* | (2023.01) | |
| *H10K 59/131* | (2023.01) | |

(Continued)

(52) U.S. Cl.
CPC ......... *H10K 59/122* (2023.02); *H10K 50/824* (2023.02); *H10K 50/86* (2023.02); *H10K 59/131* (2023.02); *H10K 59/353* (2023.02); *H10K 59/38* (2023.02); *H10K 59/80522* (2023.02); *H10K 59/878* (2023.02)

(58) Field of Classification Search
CPC ................. H10K 50/86; H10K 50/824; H10K 50/00–88; H10K 59/122; H10K 59/353; H10K 59/38; H10K 59/80522; H10K 59/878; H10K 59/352; H10K 59/10–221; H10K 59/131–1315
See application file for complete search history.

(56) References Cited

U.S. PATENT DOCUMENTS

| | | | | |
|---|---|---|---|---|
| 2010/0149153 A1* | 6/2010 | Yamamoto | ........... | G09G 3/3233 345/214 |
| 2015/0097168 A1* | 4/2015 | Hanawa | ............... | H10K 59/121 257/40 |

(Continued)

FOREIGN PATENT DOCUMENTS

| | | | | |
|---|---|---|---|---|
| CN | 111477111 A | * | 7/2020 | ............. G09F 9/301 |
| JP | 2008-135325 A | | 6/2008 | |

(Continued)

OTHER PUBLICATIONS

Translation of Luo (Year: 2020).*
Translation of Song (Year: 2015).*

*Primary Examiner* — Shahed Ahmed
*Assistant Examiner* — Rhys Poniente Sheker
(74) *Attorney, Agent, or Firm* — Maier & Maier, PLLC

(57) ABSTRACT

According to one embodiment, a display device includes a base, a wiring layer disposed on the base, and in which a plurality of wiring lines are disposed, a display element disposed on the wiring layer and including an organic layer and a metal wiring line disposed to surround the display element, and the wiring layer includes a first portion in which wiring lines are densely arranged and a second portion in which wiring lines are sparsely arranged, and a width of a portion of the metal wiring line, which is disposed on a side of the second portion is greater than a width of a portion of the metal wiring line, disposed on a side of the first portion.

2 Claims, 5 Drawing Sheets

(51) Int. Cl.
*H10K 59/35* (2023.01)
*H10K 59/38* (2023.01)
*H10K 59/80* (2023.01)

(56) References Cited

U.S. PATENT DOCUMENTS

| | | | |
|---|---|---|---|
| 2019/0096972 A1* | 3/2019 | Teraguchi | H10K 50/856 |
| 2022/0140061 A1* | 5/2022 | Nitta | H10K 59/353 |
| | | | 257/89 |
| 2023/0273487 A1* | 8/2023 | Hayashi | G02F 1/1345 |
| | | | 349/33 |

FOREIGN PATENT DOCUMENTS

| | | | | | |
|---|---|---|---|---|---|
| JP | 2020034754 | A | * | 3/2020 | G02F 1/1339 |
| KR | 20150002119 | A | * | 1/2015 | H10K 59/121 |

\* cited by examiner

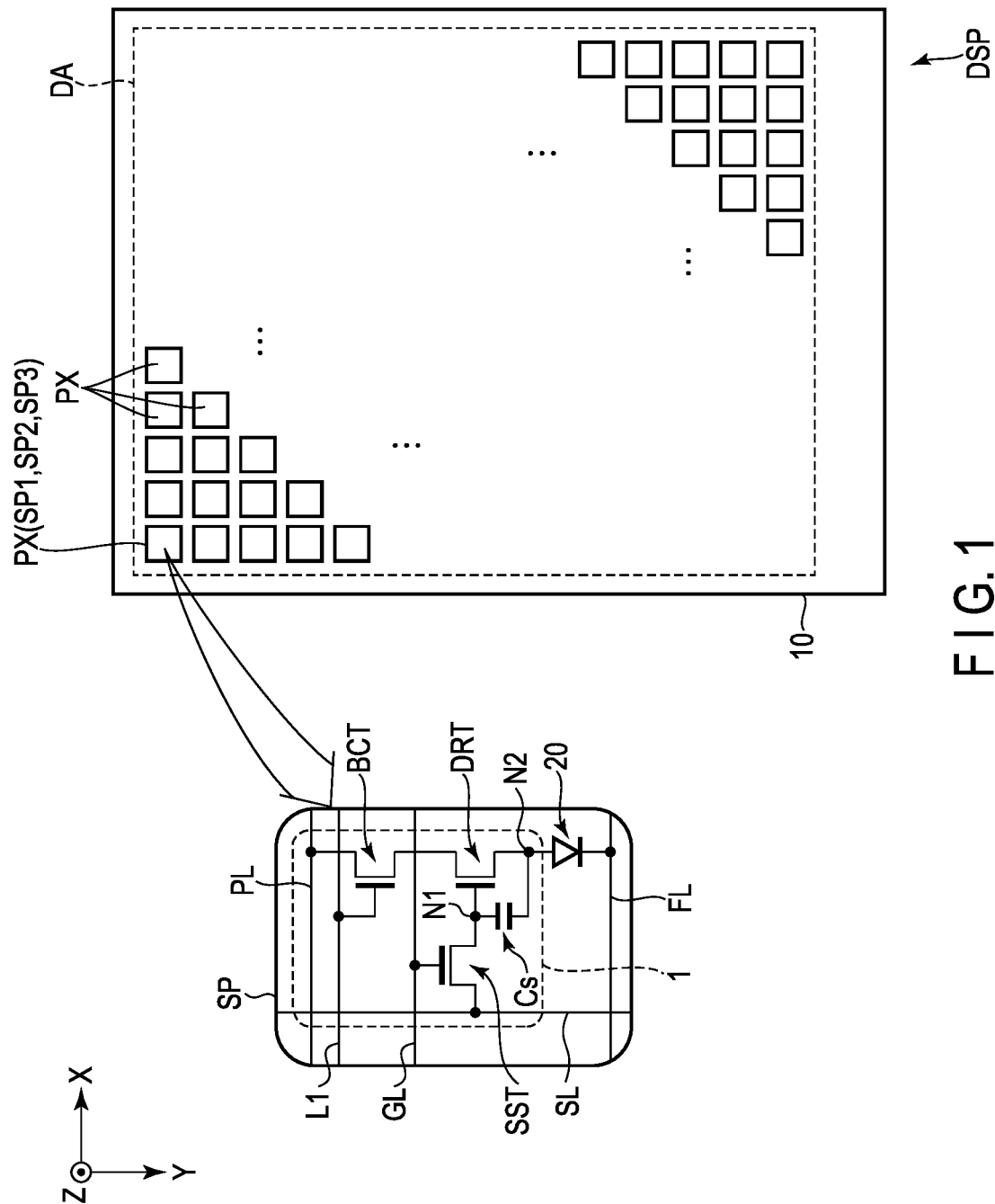
F I G. 1

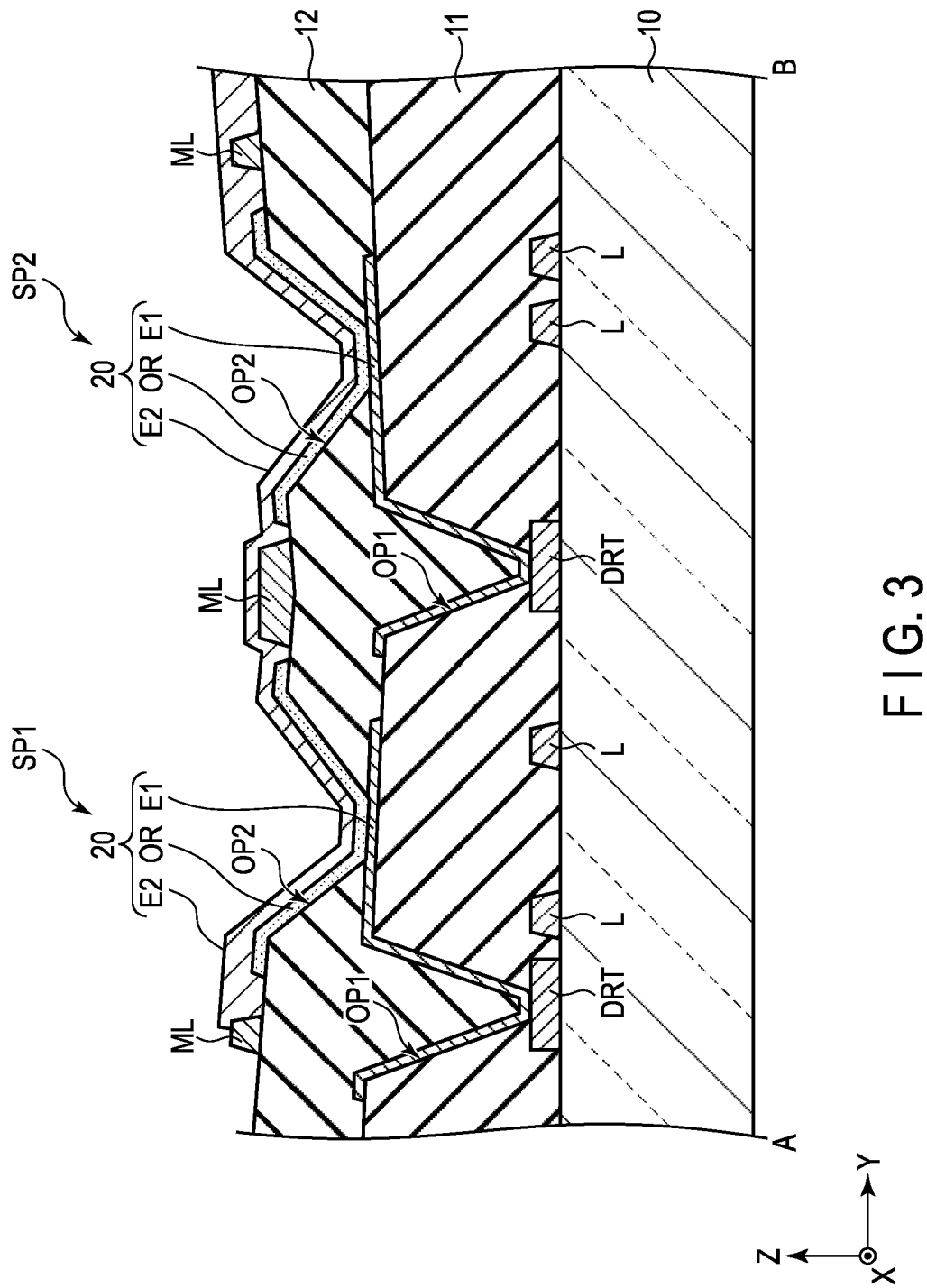
F I G. 3

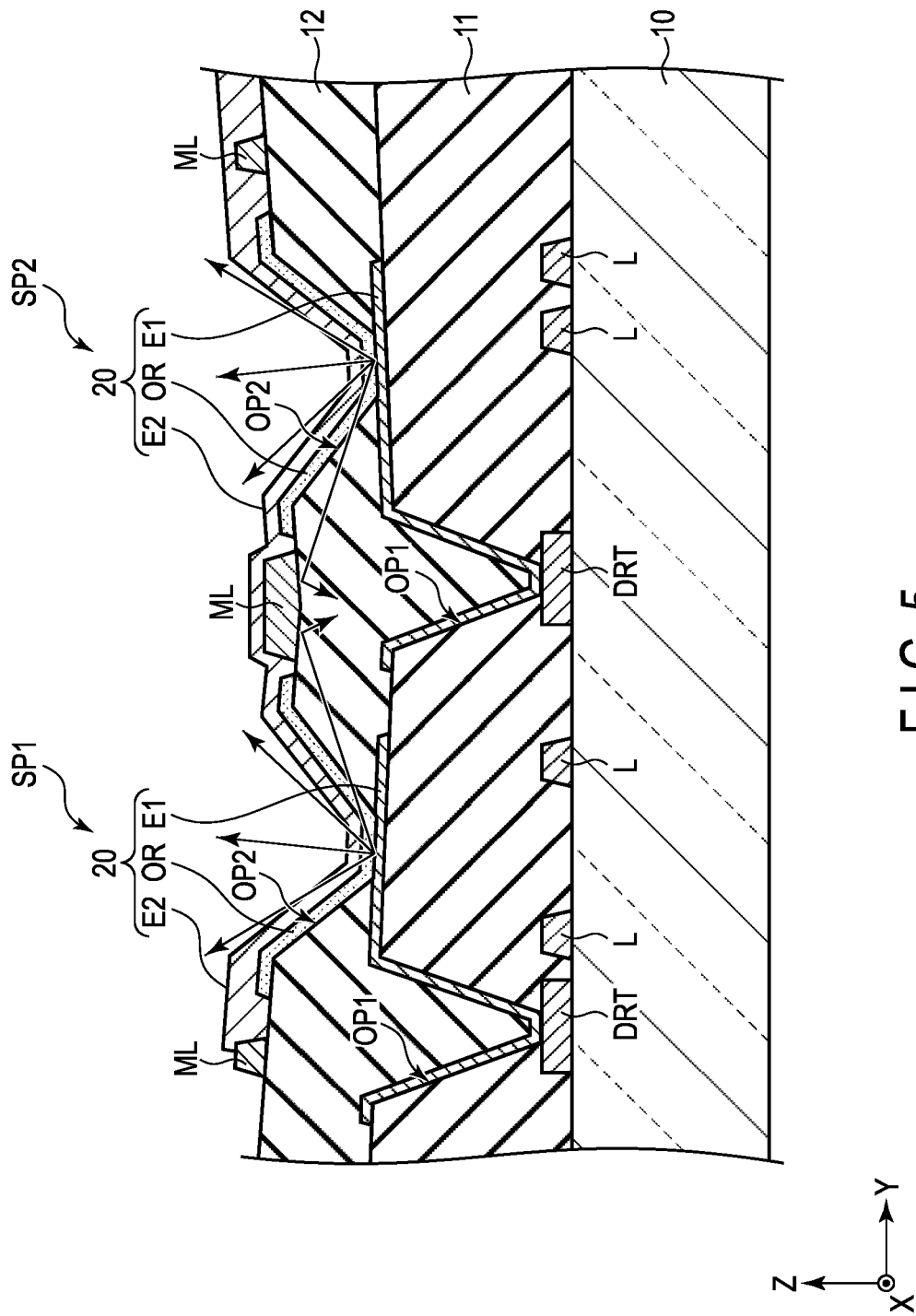
F I G. 5

DISPLAY DEVICE

CROSS-REFERENCE TO RELATED APPLICATIONS

This application is based upon and claims the benefit of priority from Japanese Patent Application No. 2021-057694, filed Mar. 30, 2021, the entire contents of which are incorporated herein by reference.

FIELD

Embodiments described herein relate generally to a display device.

BACKGROUND

In recent years, display devices in which an organic light-emitting diode (OLED) is applied as a display element have been used in practical applications. Such display devices comprise an organic layer between the pixel electrode and the common electrode. The organic layer includes functional layers such as a hole transport layer and an electron transport layer in addition to the light-emitting layer.

While the practical use of display devices in which organic light-emitting diodes are applied is progressing, there is a demand of improving the quality in display of such display devices.

BRIEF DESCRIPTION OF THE DRAWINGS

FIG. 1 is a diagram showing a configuration example of a display device according to an embodiment.

FIG. 3 is a diagram showing a cross-section of the subpixel taken along line A-B shown in FIG. 2.

FIG. 5 is a diagram illustrating an effect obtained by the configuration of this embodiment.

DETAILED DESCRIPTION

Figure 2:
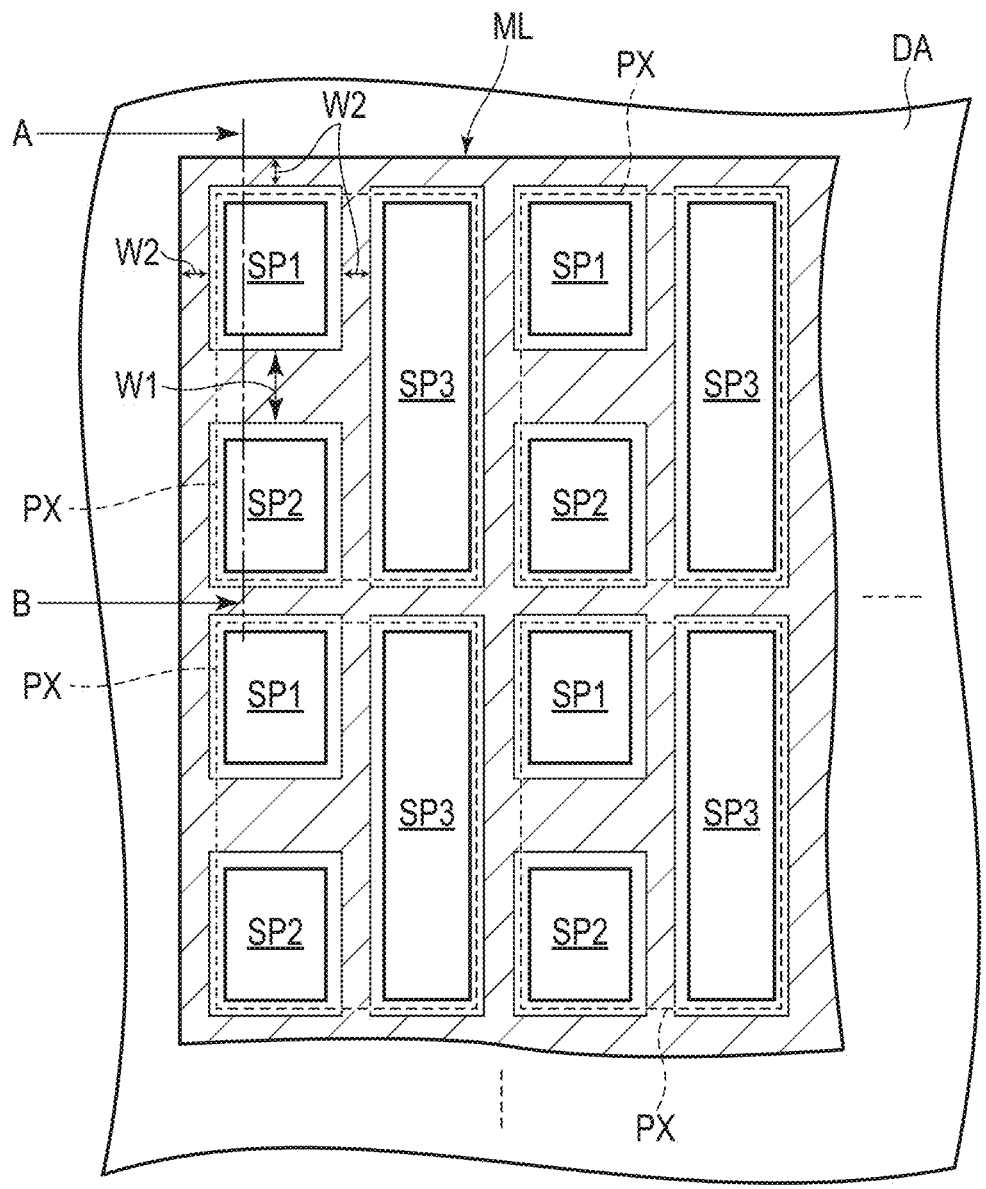
FIG. 2 is a plan view showing a pixel and a subpixel shown in FIG. 1.

In general, according to one embodiment, a display device comprises a base, a wiring layer disposed on the base, and in which a plurality of wiring lines are disposed, a display element disposed on the wiring layer and including an organic layer and a metal wiring line disposed to surround the display element, and the wiring layer includes a first portion in which wiring lines are densely arranged and a second portion in which wiring lines are sparsely arranged, and a width of a portion of the metal wiring line, which is disposed on a side of the second portion is greater than a width of a portion of the metal wiring line, disposed on a side of the first portion.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as an X direction or a first direction, a direction along the Y axis is referred to as a Y direction or a second direction and direction along the Z axis is referred to as a Z direction or a third direction. A plane defined by the X axis and the Y axis is referred to as an X-Y plane, and a plane defined by the X axis and the Z axis is referred to as an X-Z plane. Further, viewing towards the X-Y plane is referred to as planar view.

In some of the embodiments, a display device DSP is an organic electroluminescent display comprising an organic light-emitting diode (OLED) as the display element, which can be installed, for example, in television sets, personal computers, mobile terminals, cell phones and the like. Note that the display elements described below can be applied as a light-emitting element in an illumination device, and the display device DSP can be diverted to other electronic devices such as illumination devices.

FIG. 1 is a diagram showing a configuration example of the display device DSP according to this embodiment. The display device DSP comprises a display unit DA that displays images, on an insulating base 10. The base 10 may be glass or a flexible resin film.

The display unit DA comprises a plurality of pixels PX arranged in a matrix along the first direction X and the second direction Y. The pixels PX each comprises a plurality of subpixels SP1, SP2 and SP3. For example, the pixel PX comprises a red subpixel SP1, a green subpixel SP2 and a blue subpixel SP3. Note that besides the three-color subpixels mentioned above, the pixel PX may comprise four or more subpixels of other colors such as white and the like.

A configuration example of one subpixel SP contained in the pixel PX will now be briefly described.

The subpixel SP comprises a pixel circuit 1 and a display element 20 that is driven and controlled by the pixel circuit 1. The pixel circuit 1 comprises a pixel selection switch SST, a drive transistor DRT, an output switch BCT and a capacitor Cs. The pixel selection switch SST, the drive transistor DRT and the output switch BCT are switch elements formed from thin-film transistors (TFTs), for example, which include a gate electrode, a source electrode and a drain electrode, respectively.

In the pixel selection switch SST, the gate electrode is connected to a scanning line GL, the source electrode is connected to a signal line SL, and the drain electrode is connected to a node N1. The node N1 is connected to the drain electrode of the pixel selection switch SST, the gate electrode of the drive transistor DRT, and one of the electrodes which constitutes the capacitor Cs. When the pixel selection switch SST is turned on in response to the scanning signal supplied from the scanning line GL, it captures the video signal supplied from the signal line SL.

In the drive transistor DRT, the gate electrode is connected to the node N1, the source electrode is connected to the drain electrode of the output switch BCT, and the drain electrode is connected to a node N2. The node N2 is connected to the drain electrode of the drive transistor DRT, the other electrode that constitutes the capacitor Cs, and an anode of the display device 20. The drive transistor DRT outputs a drive current of a current amount according to the video signal described above, to the display element 20.

In the output switch BCT, the gate electrode is connected to an output control signal line L1, the source electrode is connected to a power line PL, and the drain electrode is connected to the source electrode of the drive transistor DRT. The output switch BCT is a switch to control the period of emission of the light which the display element 20 emits.

The cathode of the display element 20 is connected to a power supply line FL. Note that the configuration of the pixel circuit 1 is not limited to that of the example illustrated.

The display element 20 is an organic light-emitting diode (OLED), which is a light-emitting element. For example, the subpixel SP1 comprises a display element that emits light corresponding to a wavelength of a red color, the subpixel SP2 comprises a display element that emits light corresponding to a wavelength of a green color, and the subpixel SP3 comprises a display element that emits light corresponding to a wavelength of a blue color. With multiple subpixels SP1, SP2 and SP3 with different display colors provided in the pixel PX, it is possible to realize multiple color display.

Note, however, the display elements 20 of the subpixels SP1, SP2 and SP3 may be configured to emit light of the same color. In this way, monochromatic display can be realized.

Further, when the display elements 20 of the subpixels SP1, SP2 and SP3 are configured to emit white light, a respective color filter may be placed to oppose each display element 20. For example, the subpixel SP1 comprises a red color filter opposing the display element 20, the subpixel SP2 comprises a green color filter opposing the display element 20, and the subpixel SP3 comprises a blue color filter opposing the display element 20. With this configuration, it is possible to realize multi-color display.

When the display elements 20 of the subpixels SP1, SP2 and SP3 are configured to emit ultraviolet light, a photo-conversion layer should be disposed to oppose the display element 20, and thus multi-color display can be realized.

FIG. 2 is a plan view showing the sub-pixels SP1, SP2 and SP3 contained in the pixels PX.

The sub-pixels SP1, SP2 and SP3 contained in one pixel PX are formed into rectangular shapes extending along the second direction Y, respectively in the display area DA. The sub-pixel SP1 comprising a display element that emits light corresponding to the red wavelength and the sub-pixel SP2 comprising a display element that emits light corresponding to the green wavelength 2 are aligned adjacent to each other along the second direction Y. Further, the sub-pixels SP1 and SP2 and the sub-pixel SP3, comprising a display element that emits light corresponding to the blue wavelength, are aligned adjacent to each other along the first direction X. The size of the sub-pixels SP1 and SP2 (the area in the X-Y plane) is smaller than that of the sub-pixel SP3.

FIG. 2 illustrates the example case where the subpixels SP1, SP2 and SP3 are arranged in penta-tile fashion is provided, but the arrangement mode of the subpixels SP1, SP2 and SP3 is not limited to this. The subpixels SP1, SP2 and SP3 may be arranged in a stripe mode, for example.

The metal wiring ML is placed between the pixels PX and the sub-pixels SP1, SP2 and SP3 contained in each pixel PX, so as to surround each pixel PX and the sub-pixels SP1, SP2 and SP3 contained in each pixel PX. The pixels PX and the sub-pixels SP1, SP2 and SP3 contained in each pixel PX are partitioned from each other by the metal wiring line ML.

In the metal wiring line ML, a width W1 of the portion thereof placed between the sub-pixels SP1 and SP2 contained in a pixel PX is greater than a width W2 of the other portion. Note that the reason why the width W1 of the metal wiring ML placed between the sub-pixels SP1 and SP2 is larger than the width W2 of the other part will be explained later.

FIG. 3 is a diagram showing a cross-section of the sub-pixel SP taken along line A-B shown in FIG. 2.

The pixel circuit 1 shown in FIG. 1 is placed on the base 10 and covered by an insulating layer 11. FIG. 3 shows only the drive transistor DRT contained in the pixel circuit 1 in a simplified form. The insulating layer 11 is equivalent to an underlying base layer of the display element 20, and is made of, for example, an insulating material such as polyimide, acrylic resin, silicon nitride, (SiN), silicon oxide (SiO) or the like.

The layer in which the drive transistor DRT is disposed is referred to as a wiring layer, and in the wiring layer, a number of wiring line L are arranged in addition to the wiring layer. The wiring lines L include, for example, scanning lines GL, signal lines SL, power lines PL, power supply lines FL, pixel selection switches SST, output switches BCT and the like. For convenience of description, In FIG. 3, all of the various wiring lines and switch elements described above are not illustrated as wiring lines L but in practice, the various wires and switch elements described above are disposed as the wiring lines L.

Note here the configuration in which a number of wiring lines L are arranged on the same layer as that of the drive transistor DRT is shown here, but it is not limited to this case. For example, some of the wiring lines L may be arranged, for example, in another layer not shown in the figure, which is further provided between the base material 10 and the insulating layer 11. In this case, these multiple layers in which the drive transistor DRT and the wiring lines L are disposed are collectively referred to as wiring layers.

The display element 20 comprises a lower electrode E1, an organic layer OR and an upper electrode E2. The organic layer OR is disposed to be sandwiched between the lower electrode E1 and the upper electrode E2.

The lower electrode E1 is an electrode provided for each subpixel or each display element, and is electrically connected to the drive transistor DRT. The lower electrode E1 with such a configuration may be, in some cases, referred to as a pixel electrode, reflective electrode, anode or the like.

The upper electrode E2 is an electrode provided over a plurality of subpixels or a plurality of display elements. The upper electrode E2 with such a configuration may be, in some cases, referred to as a common electrode, counter electrode, cathode or the like.

The upper electrode E2 is connected to the metal wiring lines ML. The metal wiring lines ML are each made of, for example, a low-resistance metal material such as silver (Ag), aluminum (Al), titanium (Ti), molybdenum (Mo), tungsten (W) or the like. The metal wiring lines ML may be a single layer formed of one of the metal materials listed above, or it may be a stacked body in which some of the metal materials mentioned above are stacked one on another.

The metal wiring lines ML are connected to the upper electrode E2 so as to made the upper electrode E2 low-resistance. Further, the metal wiring lines ML are disposed between two adjacent organic layers OR, and has a role of dividing these organic layers OR from each other.

The lower electrode E1 is placed on the insulating layer 11 and is connected to the drive transistor DRT via an opening OP1 formed in the insulating layer 11. The opening OP1 is a through-hole formed in the area overlapping the drive transistor DRT and penetrating the insulating layer 11 to the drive transistor DRT.

The lower electrode E1 is a transparent electrode formed of, for example, a transparent conductive material such as indium tin oxide (ITO), indium zinc oxide (IZO) or the like. The lower electrode E1 may be a metal electrode formed of a metallic material such as silver (Ag), aluminum (Al), titanium (Ti), molybdenum (Mo), tungsten (W) or the like. The lower electrode E1 may also be of a stacked structure of a transparent electrode and a metal electrode. For example, the lower electrode E1 may be configured as a stacked body consisting of a transparent electrode, a metal electrode and a transparent electrode stacked in this order, or may be configured as a stacked body consisting of three or more layers.

An insulating layer 12 is provided on the insulating layer 11 to cover the lower electrode E1. The insulating layer 12 comprises an opening OP2, and a part of the lower electrode E1 is exposed in the opening OP2.

The organic layer OR is connected to the lower electrode E1 via the opening OP2. In this embodiment, the organic layer OR includes a light-emitting layer that emits light in one of the colors red, green, or blue. The organic layer OR may include, in addition to the light-emitting layer, functional layers such as a hole injection layer, a hole transport layer, an electron blocking layer, a hole blocking layer, an electron transport layer, an electron injection layer, and the like. For this reason, the organic layer OR may be of a stacked body in which a plurality of layers including at least one of the functional layers listed above are stacked, in addition to the light-emitting layer, though FIG. 3 illustrates the organic layer OR as a single layer.

The metal wiring lines ML are disposed on the insulating layer 12. The metal wiring lines ML are arranged to surround the organic layer OR of the sub-pixel SP1 and the organic layer OR of the sub-pixel SP2, respectively. With this configuration, in the cross-sectional view of FIG. 3, the metal wiring lines ML are located adjacent to both ends of the organic layer OR of the sub-pixel SP1, and adjacent to both ends of the organic layer OR of the sub-pixel SP2, respectively. As will be described in detail later, the width W1 of the metal wiring line ML located between the organic layer OR of the sub-pixel SP1 and the organic layer OR of the sub-pixel SP2 is greater than the width W2 of the metal wiring line ML located in other areas.

The upper electrode E2 is a common layer disposed over a plurality of pixels PX (subpixels SP), it covers the insulating layer 12 and the organic layer OR contained in each of these pixels PX, and is connected to the metal wiring lines FL.

The upper electrode E2 is a transparent electrode formed of a transparent conductive material such as ITO or IZO. Note that the upper electrode E2 may be a semi-transparent metal electrode formed of a metal material such as magnesium (Mg), silver (Ag), aluminum (Al) or the like.

When the potential of the lower electrode E1 is relatively higher than that of the upper electrode E2, the lower electrode E1 is equivalent to the anode and the upper electrode E2 is equivalent to the cathode. When the potential of the upper electrode E2 is relatively higher than that of the lower electrode E1, the upper electrode E2 is equivalent to the anode and the lower electrode E1 is equivalent to the cathode.

In this embodiment, such an example case is assumed, where the lower electrode E1 is equivalent to the anode and the upper electrode E2 is equivalent to the cathode.

According to the configuration shown in FIG. 3, the light-emitting area of the display device 20 can be formed in the area where the organic layer OR disposed between the lower electrode E1 in the opening OP2 and the upper electrode E2 placed as the common layer is located. But, the portion of the organic layer OR, which is disposed between the slope of the opening OP2 and the upper surface of the insulating layer 12 does not substantially emits light because the insulating layer 12 intervenes between the lower electrode E1 and the upper electrode E2.

As shown in FIG. 3, the lower electrode E1 of the sub-pixel SP1 and the lower electrode E2 of the sub-pixel SP2, which are disposed on the insulating layer 11 are both disposed at an angle. In more detail, the lower electrode E1 of the sub-pixel SP1 includes a downward slope to the right in FIG. 3, and the lower electrode E1 of the sub-pixel SP2 includes an upward slope to the right in FIG. 3.

The reason why the lower electrode E1 of the sub-pixel SP1 includes a downward slope in FIG. 3 is because the length (thickness) of the insulating layer 11 along the third direction Z is different between the opening OP1 side and the opening OP2 side. The reason why the thickness of the opening OP1 side of the insulating layer 11 differs from the thickness of the opening OP2 side of the insulating layer 11 is that the wiring density of the drive transistors DRT and wiring lines L placed in the wiring layer differs between the opening OP1 side and the opening OP2 side.

The thickness of the insulating layer 11 becomes greater as the layer covers an area with higher wiring density, and less as it covers an area with lower wiring density. FIG. 3 shows the case on the assumption that in the sub-pixel SP1, the wiring density on the opening OP1 side is higher than that on the opening OP2 side. Therefore, the thickness of the insulating layer 11 on the opening OP1 side is greater than the thickness of the insulating layer 11 on the opening OP2 side. As a result, the lower electrode E1 of the subpixel SP1 includes a downward slope to the right as shown in FIG. 3.

Similarly, the reason why the lower electrode E1 of the sub-pixel SP2 includes an upward slope to the right in FIG. 3 is because the wiring density on the opening OP1 side is lower than that on the opening OP2 side, and the thickness on the opening OP1 side of the insulating layer 11 is less than the thickness on the opening OP2 side of the insulating layer 11.

As described above, the wiring layer includes a portion (a first portion) of a high wiring density and a portion (second portion) of a low wiring density, and the thickness of the insulating layer 11, which covers the higher wiring-density portion tends to be less than the thickness of insulating layer 11, which covers the lower wiring-density portion.

Due to the configuration that the lower electrode E1 of the sub-pixel SP1 includes a downward slope to the right in FIG. 3, the elements (for example, the organic layer OR and the like) placed above the lower electrode E1 are disposed to have a similar downward slope to the right as well. As the lower electrode E2 of the sub-pixel SP2 has an upward slope to the right in FIG. 3, the elements placed above the lower electrode E1 are disposed to have a similar an upward slope to the right.

Therefore, as shown in FIG. 3, the organic layer OR equivalent to the emitting surface of the light emitted from the display element 20 of the sub-pixel SP1 is disposed to be inclined to the right in the figure, and the organic layer OR equivalent to the emitting surface of the light emitted from the display element 20 of the sub-pixel SP2 is disposed to be inclined to the left in the figure. With this configuration, the amount of light emitted from the display element 20 of the sub-pixel SP1 is higher as the location is further right in the figure (the intensity of the light is stronger as further right in the figure), whereas the amount of light emitted from the display element 20 of the sub-pixel SP2 is higher as the location is further left in the figure (the intensity of the light is stronger as further left in the figure). In short, the optical amount of the light emitted from the display element 20 of each sub-pixel SP increases as the location is further on the area overlapping the portion where the wiring density is lower, and decreases as the location is further on the area overlapping the portion where the wiring density is higher.

Here, the effect of this embodiment will be described using the comparative example shown in FIG. 4. The comparative example is intended to illustrate some of the effects that can be achieved by this embodiment, and does not exclude the effects that are common to the comparative example and the present embodiment from the scope of the present embodiment.

Figure 4:
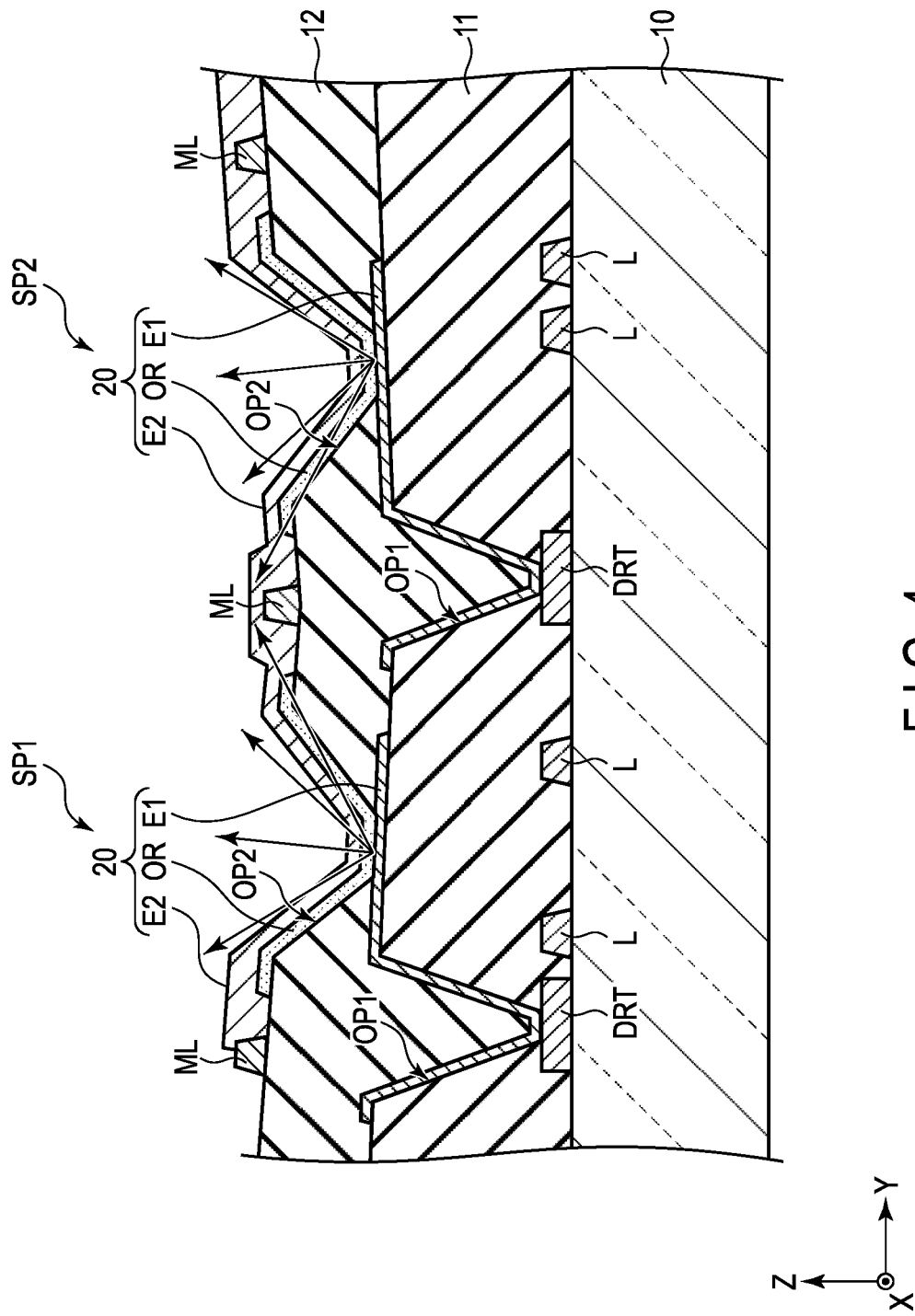
FIG. 4 is a diagram showing a cross-section of a sub-pixel configured according to a comparative example.

The configuration of the comparative example is different from the that of this embodiment, as shown in FIG. 4, in that the width of the metal wiring line ML located between the organic layer OR of the sub-pixel SP1 and the organic layer OR of the sub-pixel SP2 is the width W2, which is similar to the width of the metal wiring lines ML located in other parts. In other words, the configuration of the comparative example is different from that of this embodiment in that the width of the metal wiring ML located between the organic layer OR of the sub-pixel SP1 and the organic layer OR of the sub-pixel SP2 is less than that of this embodiment.

In the configuration of the comparative example, the organic layer OR of the sub-pixel SP1 is disposed to be inclined to the right in the figure, and the organic layer OR of the sub-pixel SP2 disposed to be inclined to the left in the figure, as in the case of the embodiment. With this configuration, as described above, the amount of light emitted from the display element 20 of the sub-pixel SP1 increases as it is further right in the figure, and the amount of light emitted from the display element 20 of the sub-pixel SP2 increases as it is further left in the figure.

If the amount of light emitted from the display element 20 increases only in a certain direction, the azimuthal dependence in the viewing angle may undesirably occur. For example, when a user observes an image displayed on the display unit DA, the user can observe the brightly displayed image when the user observes the display unit DA from one direction, whereas the user can observe the dark displayed image when the user observes the display unit DA from another direction. Thus, the color tone may undesirably vary depending on the observing direction.

By contrast, in the configuration of this embodiment, the width of the metal wiring lines ML located on the side where the amount of light is large (in other words, the width of the metal wiring lines ML located on the side where the wiring density is low) is set larger than that of other parts. According to this, as shown in FIG. 5, part of the light emitted from the display element 20 of the sub-pixel SP1 toward the right in the figure is reflected by the metal wiring lines ML to be able to prevent it from being taken out to the outside (in other words, the amount of light on the side with a larger amount of light can be reduced). With this configuration, the light emitted from the display element 20 can be isotropically taken out to the outside. Similarly, as shown in FIG. 5, part of the light emitted from the display element 20 of the sub-pixel SP2 toward the left in the figure is reflected by the metal wiring lines ML so as not to be taken out to the outside. Thus, the light emitted from the display element 20 of the sub-pixel SP2 can be isotropically taken out to the outside.

With this configuration, it is possible to suppress the occurrence of the azimuthal dependence of the viewing angle described above, and to improve the display quality of the display device DSP.

According to one embodiment described above, the display device DSP comprises metal wiring lines ML which partition pixels PX and sub-pixels SP1, SP2 and SP3 contained in each pixel PX, from each other. The metal wiring lines ML have a width W2 on the side of the portion where the wiring density of the wiring layers is high, and a width W1, which is greater than the width W2, on the side of the portion where the wiring density is low. With this configuration, part of the light on the side of the portion where the wiring density is low, which tends have a large amount of light, can be reflected by the wide metal wiring lines ML so as not to be taken out to the outside. That is, it is possible to reduce the amount of light on the side of the portion where the wiring density is low to approximate the amount to that of the side of the portion where the wiring density is high (in other words, the amount of light on the side with a large amount of light can be reduced to approximate to the amount of light on the side with a small amount of light). In this manner, it is possible to suppress the occurrence of the above-described azimuthal dependence of the viewing angle, and to provide a display device DSP that can improve the display quality.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a base;
   a wiring layer disposed on the base, and in which a plurality of wiring lines are disposed;
   a display element disposed on the wiring layer and including an organic layer;
   a metal wiring line disposed to surround the display element, and
   an insulating layer disposed between the wiring layer and the display element to cover the wiring lines, wherein
   the wiring layer includes a first portion in which wiring lines are densely arranged and a second portion in which wiring lines are sparsely arranged,
   a width of a portion of the metal wiring line, which is disposed on a side of the second portion is greater than a width of a portion of the metal wiring line, disposed on a side of the first portion,
   the insulating layer includes a portion covering the first portion and a portion covering the second portion, which have thicknesses different from each other,
   the thickness of the portion of the insulating layer, which covers the first portion, is greater than the thickness of the portion which covers the second portion,
   a surface of the insulating layer is inclined in a downward direction from the portion which covers the first portion to the portion which covers the second portion, an emitting surface of the display element is inclined, similarly to the surface of the insulating layer, in a downward direction from a region overlapping the first portion to a region overlapping the second portion in plan view, the display element includes a lower electrode and an upper electrode disposed to sandwich the organic layer therebetween, and the metal wiring is disposed on a same layer as that of the organic layer and is in contact with the upper electrode.

2. The display device of claim 1, wherein the metal wiring line is formed of a low-resistance metal material.

\* \* \* \* \*